United States Patent
Aspar et al.

(10) Patent No.: US 6,808,967 B1
(45) Date of Patent: Oct. 26, 2004

(54) METHOD FOR PRODUCING A BURIED LAYER OF MATERIAL IN ANOTHER MATERIAL

(75) Inventors: Bernard Aspar, Rives (FR); Michel Bruel, Veurey (FR); Hubert Moriceau, St Egrève (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/806,511

(22) PCT Filed: Oct. 13, 1999

(86) PCT No.: PCT/FR99/02476

§ 371 (c)(1),
(2), (4) Date: Apr. 16, 2001

(87) PCT Pub. No.: WO00/22669

PCT Pub. Date: Apr. 20, 2000

(30) Foreign Application Priority Data

Oct. 15, 1998 (FR) .............................. 98 12950

(51) Int. Cl.⁷ .......................... H01L 21/00; H01L 21/84; H01L 21/76
(52) U.S. Cl. ....................... 438/162; 438/407; 438/440; 438/475; 438/766
(58) Field of Search ................................ 438/162, 407, 438/440, 475, 766, 530

(56) References Cited

U.S. PATENT DOCUMENTS

| | | | | |
|---|---|---|---|---|
| 3,849,204 A | * | 11/1974 | Fowler | 438/475 |
| 4,837,172 A | | 6/1989 | Mizuno et al. | 437/11 |
| 5,310,689 A | * | 5/1994 | Tomozane et al. | 438/766 |
| 5,374,564 A | | 12/1994 | Bruel | 437/24 |
| 5,633,174 A | | 5/1997 | Li | 438/475 |
| 6,159,824 A | * | 12/2000 | Henlyey et al. | 438/455 |
| 6,190,998 B1 | | 2/2001 | Bruel et al. | 438/407 |

FOREIGN PATENT DOCUMENTS

| | | |
|---|---|---|
| EP | 0 801 419 | 10/1997 |
| FR | 2 681 472 | 10/1993 |
| FR | 2 748 850 | 7/1998 |

OTHER PUBLICATIONS

Akito Hara, et al., International Conference on Solid State Devices and Materials, pp. 35–37, "Oxygen Precipitation Control by Hydrogen and Preannealing at 425° C. in Czochralski Silicon Crystals", Aug. 1992.
Patent Abstracts of Japan, vol. 005, No. 181 (E–083), Nov. 20, 1981, JP 56–110247, Sep. 1, 1981.

* cited by examiner

*Primary Examiner*—Alexander Ghyka
(74) *Attorney, Agent, or Firm*—Oblon, Spivak, McClelland, Maier & Neustadt, P.C.

(57) ABSTRACT

The aim of the invention is a method for producing a layer (2) of a first material embedded in a substrate (1) comprising at least one second material. The method comprises the following stages:

formation in the substrate (1), at the level of the desired embedded layer, of a layer of microcavities intended to serve as centers of nucleation to produce said first material in said second material, formation of precipitate embryos from the nucleation centers formed, the precipitate embryos corresponding to the first material, growth of the precipitates from the embryos through species concentration corresponding to the first material and carried to the microcavity layer.

20 Claims, 1 Drawing Sheet

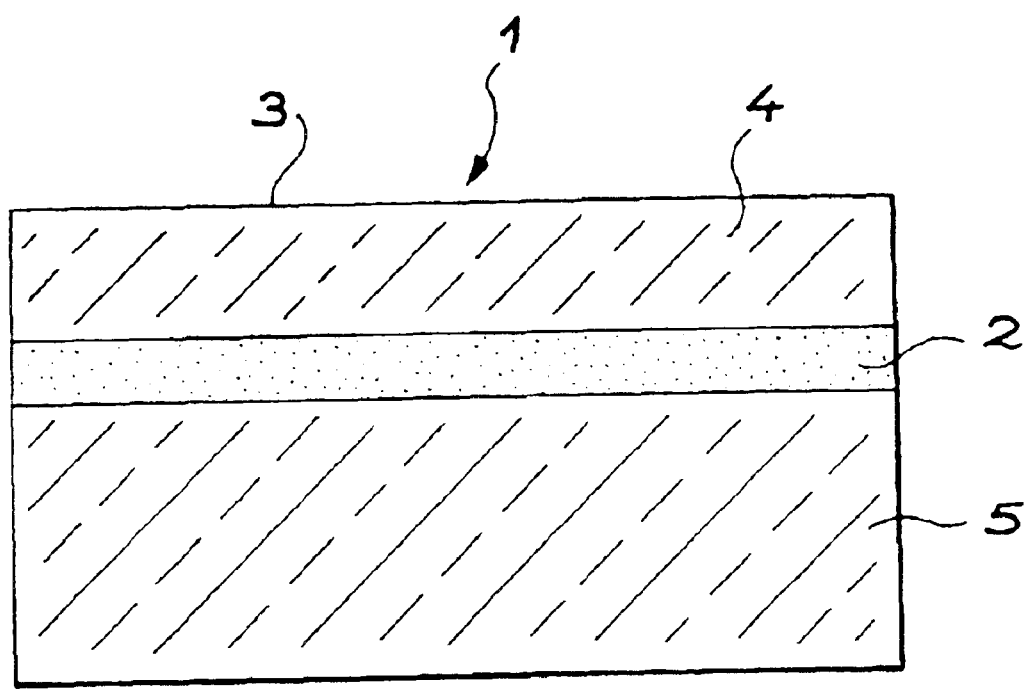

US 6,808,967 B1

METHOD FOR PRODUCING A BURIED LAYER OF MATERIAL IN ANOTHER MATERIAL

TECHNICAL FIELD

The present invention relates to a method for producing a layer of material embedded in another material. It is applicable in particular to the field of semiconductors and especially for producing substrates of the Silicon on Insulator type.

At present, substrates of the Silicon on Insulator or SOI type are of very great interest for microelectronic applications in the domain of low consumption. There are several methods for obtaining SOI substrates. Those used most these days are the SIMOX process (Separation by Implanted Oxygen) and methods based on bonding by molecular adhesion (wafer bonding). In order to obtain thin films of silicon on silica, these methods, using wafer bonding, are combined with thinning methods. As a thinning process, one can quote that revealed in document FR-A-2 681 472 where the cleavage of a substrate is obtained by coalescence, provoked by a thermal treatment of microcavities generated by ion implantation. One can also cite processes using epitaxied barrier layers and selective etching.

STATE OF PRIOR ART

It is known that implantation by bombardment of an inert gas or hydrogen in a semiconductor material (see FR-A-2 681 472), or in a solid material, crystalline or Anot (see FR-A-2 748 850), is capable of creating microbubbles (called platelets or nanoblisters) at a depth close to the average depth of ion penetration. The morphology (dimension, shape . . . ) of these defects can change during thermal treatments, in particular the size of these cavities can increase. Depending on the nature of the material and above all its mechanical properties, these cavities, present at the average depth of penetration of gas species can, depending on the thermal treatment conditions, induce surface deformations or blisters. The most important parameters to monitor to obtain these blisters are the gas dose introduced during implantation, the depth to which the gas species are implanted and the total thermal budget supplied to the material. In certain cases, the conditions of implantation are such that, after annealing, microcavities or microbubbles are present at the level of the average depth of ion implantation but their size and pressure inside these cavities are not sufficient to induce surface deformations. Then there is a continuous layer of defects embedded without any degradation of the surface. As an example, implantation of hydrogen in a silicon plate according to a dose of $3.10^{16}H^+/cm^3$ and an energy of 25 keV creates a continuous embedded layer of microcavities of about 150 nm thickness at an average depth of about 300 nm. These microcavities have an elongated shape: their size is of the order of 6 nm in length and two atomic planes in thickness. If annealing is carried out at 600° C. for 30 minutes on this plate, the microcavities grow and their size changes from 6 nm to more than 50 nm in length and from a few atomic planes to 4–6 nm in thickness. On the other hand, no surface disturbance is observed.

The presence of microcavities can also be seen in the case of implantation by helium bombardment, at the level of the average implantation depth (Rp) in silicon. In this case, the cavities have a stable form which does not change during annealing. Reference can be made to the article "Radiation damage and implanted He atom interaction during void formation in silicon" by V. RAINERI and M. SAGGIO, Appl. Phys. Lett. 71 (12), 22 Sep. 1997.

Furthermore, it is known that defects present in materials are the preferential nucleation centres for the formation of a heterogeneous phase. As an example, concerning the formation of oxide precipitates, three types of nucleation are listed in the bibliography: in the homogeneous phase, in the homogeneous phase under stresses, in heterogeneous phases (see for example the article entitled "Oxygen Precipitation in Silicon" by A. BORHESI et al., J. Appl. Phys. 77(9), 1995, pages 4169–4244). This oxygen which precipitates is contained in the initial material. It comes, for example, from the formation stage of the material.

By nucleation is meant the formation of aggregates of several oxygen atoms in silicon to form nucleation centres called "nuclei" or "precipitate embryos". More simply, nucleation can appear in crystalline sites corresponding to knots of the network where several interstitial oxygen atoms are close to each other (homogeneous nucleation) or on network defects (heterogeneous nucleation). It is known that these network defects can be point defects induced by the presence of an element exterior to the matrix (for example carbon in the silicon) or complexes such as, for example, oxygen-carbon complexes (see the article mentioned above by A. BORHESI et al.). For example, the point defects intrinsic to the material such as clusters of vacancies formed during silicon growth can also be nucleation centres for obtaining "nuclei". Furthermore, as an example of defects induced by the presence of an external element, the case can be cited of carbon introduced into the substrate to create a continuous embedded layer rich in carbon which will act as a nucleation zone. The introduction of carbon can be obtained by implantation of carbon by bombardment.

After the formation phase of these nucleation centres, to obtain a precipitate of larger size, it is necessary to have a precipitation phase. Precipitation in a material is a phenomenon of aggregation of atoms to form small particles or precipitates.

The critical radius $r_c$ defining the minimum size of precipitates capable of existing is given, for a concentration of interstitial oxygen in the material, by the equation $r_c = (2\sigma/\Delta H)(Ts/Ts-T)$ where $\sigma$ is the surface energy, $\Delta H$ is the formation enthalpy, T is the temperature expressed in Kelvins Ts is the equilibrium temperature corresponding to the given quantity of oxygen, (see the article "Oxygen Precipitation Czochralski Silicon" by R. CRAVEN, Elec. Chem. Soc., Proceedings of the 4th Int. Symp. on Silicon Materials, Science and Technology Vol. 81–5, 1981).

Starting from this equation, it can be clearly seen that the rise in temperature brings about growth of the precipitates.

To resume, defects create nucleation centres, which will serve to form precipitates which will then become bigger.

On the other hand, studies have demonstrated the possibility of reducing the number of discontinuities of the oxide layer embedded in the case of SOI substrates obtained by the "low dose" SIMOX process with the help of oxidation at high temperature (over 1350° C.) of the silicon film (see patent U.S. Pat. No. 5,589,407 and the article entitled "An Analysis of Buried-Oxide Growth in Low-dose SIMOX Wafers by High-Temperature Thermal Oxidation" vt S. MASUI et al., Proceedings 1995 IEEE International SOI Conference, October 1995). This process, named ITOX (Internal Oxidation), makes it possible to oxidise the oxide layer embedded by means of oxygen diffusion from the surface to the embedded oxide layer. Other authors demonstrate that the same phenomenon occurs at lower temperatures, of the order of 1200° C. (see article "Internal Oxidation of Low Dose Separation by Implanted Oxygen Wafers in Different Oxygen/Nitrogen Mixtures" by P. ERICSSON and S. BENGTSSON, accepted for publication in Appl. Phys. Lett.).

The latter results indicate that the introduction of oxygen into the material depends firstly on the time applied at high temperature and not on the quantity of oxygen in the annealing atmosphere. Thus it seems that the introduction of oxygen may be limited by the solubility limit of oxygen in silicon. Thus, the higher the temperature, the faster the oxidation effect for the embedded oxide layer. An example of this phenomenon indicates that at 1200° C., if 5% oxygen is introduced into nitrogen, 8 hours of annealing allow the embedded oxide layer to grow in thickness from 860 Angstrom to 1330 Angstroms. This "internal" oxidation is of interest because it reduces the density of discontinuities of the embedded oxide.

From the abstract of the document JP-A-56 110 247 a method is known for the formation of an insulating region inside a semiconductor substrate of type N. The substrate is first irradiated by light elements making it possible to create an embedded region of type P in the substrate. This region of type P is then made porous by an anodic treatment. Thermal treatment under oxygen makes the porous region insulating.

The document "Silicon on Insulator Structures Obtained by Epitaxial Growth of Silicon over Porous Silicon" by C. OULES et al., in R. Electrochem. Soc. Vol. 139, No. 12, December 1992, reveals the production of a SOI structure comprising a silicon substrate showing a porous layer formed by anodisation and supporting an epitaxial layer of silicon.

DESCRIPTION OF THE INVENTION

The invention proposes a new process for making an embedded layer of material in a substrate of another material. An original aspect of the invention consists of creating microcavities embedded in the substrate and not crystalline defects for creating traps. In particular, when the substrate is in silicon, this makes it possible to obtain a superficial layer of silicon of much higher quality and does not require the substrate to be submitted to a temperature of the order of 1300° C. in order to mend the defects created by oxygen implantation, for example. of 1300° C. in order to mend the defects created by oxygen implantation, for example.

The present invention also offers the advantage of being able to implement an implantation with a low dose of a light element (for example hydrogen) which does not induce a crystalline defect between the surface implanted and the microcavity creation zone, contrary to what happens when ions are implanted, such as oxygen, silicon or argon. This process is simple to implement, since the implantation can take place at ambient temperature.

The aim of the invention is thus a process for producing a layer of a first material embedded in a substrate comprising at least one second material, characterised in that it comprises the following stages:

formation of said substrate, at the level of the desired embedded layer, of a layer of microcavities (called "platelets" or microbubbles) intended to serve as centres of nucleation and volume accommodation to produce said first material in said second material, formation of precipitate embryos from the nucleation centres formed, the precipitate embryos corresponding to the first material, growth of the precipitates from the embryos through species concentration corresponding to the first material and carried to the microcavity layer.

The microcavity layer can be formed advantageously by introducing into the second material gaseous species, which are advantageously chosen from among hydrogen, helium and fluorine. Furthermore one can form the layer of microcavities by a gas inclusion provoked during the production of the substrate. It can also be formed from the interface constituted by solidarisation of a first substrate element and a second substrate element, supplying said substrate. The microcavity layer can then result from the presence of particles at said interface, from the surface roughness of at least one element from the first substrate element and the second substrate element, from the presence of microrecesses at the surface of at least one element from the first substrate element and the second substrate element or stresses induced at said interface.

The precipitate embryos can be formed from species present in the second material. They can also be formed from species introduced in the second material. This introduction can be carried out by diffusion activated thermally. In this case, if the formation of microcavities implements a thermal treatment, the precipitate embryos can be formed simultaneously with the microcavities.

The growth of precipitates can be carried out by concentration of species introduced into the substrate. This introduction can be carried out by thermally activated diffusion, under pressure or by means of a plasma.

The growth of precipitates can be carried out by concentration of species present in the substrate, under the effect of a thermal treatment.

If the formation of precipitate embryos and the growth of these precipitates are two operations requiring thermal treatment, these operations can be carried out simultaneously.

The invention is related in particular to the production of a semiconductor substrate provided with an embedded layer. It applies in particular to the production of a silicon substrate provided with an embedded layer of silicon oxide.

The embedded layer can be continuous or not depending on the applications foreseen. In this case, one can play on the density of the precipitates, and the utilisation of a mask protecting certain zones of the material submitted to the process according to the invention.

SHORT DESCRIPTION OF THE DRAWING

The invention will be better understood and other advantages and details will become apparent by reading the following description, given as a non-limiting example, accompanied by the attached drawing which represents, in a transversal cross-section, a substrate in which there is an embedded layer of a material different from the material constituting the substrate.

DETAILED DESCRIPTION OF THE EMBODIMENTS OF THE INVENTION

As an example, a description is given below of a process for producing a SOI substrate according to the present invention, starting from a solid silicon substrate.

The first stage consists of forming a layer of microcavities in the substrate reference 1 on the attached FIGURE.

A technique which is simple to operate consists of forming this layer of microcavities by hydrogen bombardment at doses (for example $3.10^{16} H^+/cm^2$) which makes it possible to obtain at the average penetration depth of Rp particles, and after annealing at 600° C. for 30 minutes, elongated microcavities with the length of several tens of nanometres. If the implantation energy is of the order of 50 keV, the average depth Rp of the layer of microcavities 2 is about 500 nm from the face 3 of the substrate through which the implantation is carried out. The width of the layer of microcavities 2 is then of the order of 150 nm.

The dose couple of hydrogen implanted/annealing formation of microcavities is highly dependent on the implantation parameters and in particular on the implantation temperature.

By using the term hydrogen, one means the gaseous species constituted under their atomic form, under their molecular form, under their ion form, under their isotopic form (deuterium) or yet again under their isotopic and ion form.

The SOI substrate required to have an embedded layer of silicon oxide, the phase for creation of oxide precipitate embryos can be produced from the oxygen present in the silicon of the substrate, by means of thermal treatment at a temperature comprised between 750° C. and 800° C. Given the fact that one wishes to obtain an embedded oxide layer, it is preferable that the annealing atmosphere contains oxygen. In this case, a small thickness of oxide forms at the surface of the substrate. This superficial oxide layer can be eliminated at the end of the process according to the invention.

Once the precipitate embryos are formed, they are made to grow by means of oxidation annealing. In this case two parameters have to be taken into account: the quantity of oxygen introduced into the material and the critical radius of the oxide precipitates.

The quantity of oxygen introduced into the material is controlled by the solubility limit of oxygen in silicon. The higher the temperature the higher the solubility limit.

The critical radius of oxide precipitates is increased proportionally when the temperature is raised.

Consequently, if one wishes to grow precipitates of small dimensions and not dissolve them, it is necessary to carry out the thermal treatment at a temperature lower than the degradation temperature of the precipitate. Therefore, a satisfactory compromise has to be found. One solution is to employ long annealing times with slow rises in temperature. As an example, one can proceed as follows:

- a first stage at 750° C. for 2 hours,
- a second stage at 800° C. for 3 hours,
- a third stage at 900° C. for 2 hours,
- a fourth stage at 1000° C. for 2 hours,
- a fifth stage at 1100° C. for 2 hours,
- a sixth stage at 1200° C. for 8 hours, before reducing the temperature.

Another important point to be monitored is the annealing atmosphere. If it is necessary to remain at 1200° C. for a long time to introduce oxygen into the silicon matrix, the substrate will also be oxidised substantially on its surface. In order to keep a maximum of surface silicon, it is necessary to use an atmosphere low in oxygen, for example 5% oxygen diluted in nitrogen. In this case, for a stage of 8 hours at 1200° C., the superficial oxide thickness is of the order of 120 nm and the embedded oxide layer formed is then about 50 nm. Thus one obtains an embedded layer 2 of oxide of 50 nm thickness under a thin film 4 of silicon of about 350 nm.

The thickness of the oxide layer 2 and the thin film 4 are thus conditioned by the implantation energy and the annealing conditions (atmosphere, length of time, temperature).

A variant of the procedure can consist of implanting helium with a dose of $2.10^{16} He^+/cm^2$ under an implantation energy of 100 keV and of carrying out annealing at 900° C. for 55 minutes to obtain a layer of microcavities at an average depth of about 600 nm for the implanted surface. The silicon substrate can then be oxidised in conditions (temperature and time length steps) identical to those described above, but beginning directly at 900° C. Thus one obtains, by the same procedure as before, an embedded oxide layer of 50 nm thickness under a silicon film of about 450 nm thickness.

Thus the invention makes it possible to obtain, from a solid substrate 1 in silicon, a SOI substrate constituted of a plate 5 of silicon covered with an insulating layer 2 itself covered with a thin film 4 of silicon.

Among the advantages of the process according to the invention, one can mention the fact that it makes it possible to use a single slice of the same material to provide a SOI substrate. It gives very good homogeneity to the thin film of silicon and the embedded oxide film. It can be implemented by using standard micro-electronics equipment. It also has the advantage of being simple to operate.

What is claimed is:

1. A method for producing a layer made of a first material buried in a substrate made of a second material, said substrate providing species able to combine with the second material to form the first material, the method comprising the following stages:

formation in said substrate, at the level of the desired buried layer, and by a method excluding the formation of a porous layer, of a layer of microcavities intended to serve as centers of nucleation and volume accommodation, formation of precipitate embryos of the first material from the nucleation centers, growth of the precipitates of the first material from the embryos by concentration of said species introduced into the substrate in order to obtain said layer made of the first material.

2. The method according to claim 1, in which the layer of microcavities is formed by introducing gaseous species into the second material.

3. The method according to claim 2, in which the gaseous species used to form the layer of microcavities are chosen from among hydrogen, helium and fluorine.

4. The method according to claim 1, in which the layer of microcavities is formed by an inclusion of gas provoked during formation of the substrate.

5. The method according to claim 1, in which the layer of microcavities is formed from the interface constituted by the solidarization of a first substrate element and a second substrate element, providing said substrate.

6. The method according to claim 5, in which the layer of microcavities results from the presence of particles at said interface.

7. The method according to claim 5, in which the layer of microcavities results from the surface roughness of at least one element among the first substrate element and the second substrate element.

8. The method according to claim 5, in which the layer of microcavities results from the presence of micro-recesses at the surface of at least one element among the first substrate element and the second substrate element.

9. The method according to claim 5, in which the layer of microcavities results from stresses induced at said interface.

10. The method according to claim 1, in which the precipitate embryos are formed from species present in the second material.

11. The method according to claim 1, in which the precipitate embryos are formed from species introduced into the second material.

12. The method according to claim 11, in which said introduction is carried out by thermally activated diffusion.

13. The method according to claim 12, in which, the formation of microcavities implementing a thermal treatment, the precipitate embryos are formed simultaneously with the microcavities.

14. The method according to claim 1, in which the growth of the precipitates is produced by concentration of species introduced into the substrate by thermally activated diffusion.

15. The method according to claim 1, in which the growth of the precipitates is produced by concentration of species introduced under pressure into the substrate.

16. The method according to claim 1, in which the growth of the precipitates is produced by concentration of species introduced into the substrate by means of a plasma.

17. The method according to claim 1, in which the growth of the precipitates is produced by concentration of species present in the substrate, under the effect of a thermal treatment.

18. The method according to claim 1, in which the formations of precipitate embryos and the growth of precipitates being two operations requiring a thermal treatment, these operations are carried out simultaneously.

19. The method according to claim 1, in which the layer of microcavities is formed in a semiconductor substrate.

20. The method according to claim 19, in which the substrate is silicon and the buried layer is a layer of silicon oxide.

* * * * *